(12) United States Patent
Bydder (10) Patent No.: US 7,078,898 B2
(45) Date of Patent: Jul. 18, 2006

(54) METHODS AND APPARATUS FOR MAGNETIC RESONANCE IMAGING

(75) Inventor: Mark Bydder, London (GB)

(73) Assignee: The Regents of the University of California, Oakland, CA (US)

( * ) Notice: Subject to any disclaimer, the term of this patent is extended or adjusted under 35 U.S.C. 154(b) by 85 days.

(21) Appl. No.: 10/830,984

(22) Filed: Apr. 23, 2004

(65) Prior Publication Data

US 2005/0001618 A1    Jan. 6, 2005

Related U.S. Application Data

(60) Provisional application No. 60/465,035, filed on Apr. 24, 2003.

(51) Int. Cl.
*G01V 3/00* (2006.01)

(52) U.S. Cl. .................. 324/309; 324/307
(58) Field of Classification Search ............ 324/309, 324/307, 306
See application file for complete search history.

(56) References Cited

U.S. PATENT DOCUMENTS

| | | | | |
|---|---|---|---|---|
| 6,242,916 B1 * | 6/2001 | King | ............. | 324/309 |
| 6,393,313 B1 * | 5/2002 | Foo | ............. | 600/410 |
| 6,714,010 B1 * | 3/2004 | Madore | ............. | 324/307 |
| 6,903,551 B1 * | 6/2005 | Madore | ............. | 324/309 |

OTHER PUBLICATIONS

McGibney G, Smith MR, Nichols ST, Crawley A. Quantitative evaluation of several partial Fourier reconstruction algorithms used in MRI. *Magn Reson Med* 1993;30:51-59.
Sodickson DK, Manning WJ. Simultaneous acquisition of spatial harmonics (SMASH): ultra-fast imaging with radiofrequency coil arrays. *Magn Reson Med* 1997;38:591-603.
Jakob PM, Griswold MA, Edelman RR, Sodickson DK. AUTO-SMASH: a self-calibrating technique for SMASH imaging. *MAGMA* 1998;7:42-54.
Pruessmann KP, Weiger M, Scheidegger MB, Boesiger P. SENSE:Sensitivity encoding for fast MRI. *Magn Reson Med* 1999;42: 952-962.
Kyriakos WE, Panych LP, Kacher DF, Westin CF, Bao SM, Mulkern RV, Jolesz FA. Sensitivity profiles from an array of coils for encoding and reconstruction in parallel (SPACE RIP). *Magn Reson Med* 2000;44:301-8.
Bydder M, Larkman DJ, Hajnal JV. Generalized SMASH imaging. *Magn Reson Med* 2002;47:160-170.

(Continued)

*Primary Examiner*—Louis M. Arana
(74) *Attorney, Agent, or Firm*—Greer, Burns & Crain, Ltd (57) ABSTRACT

A system for generating magnetic resonance images includes an MRI scanner for obtaining data from a pre-scan and data from a selected scan. A processor determines whether the data from the selected scan includes errors based on the data from the pre-scan, and requests the MRI scanner to reacquire the data from the selected scan if data is found to include errors, or converts the data from the selected scan to an image if no error is found. A display device displays the image converted by the processor.

12 Claims, 5 Drawing Sheets

OTHER PUBLICATIONS

Wiesinger F, Pruessmann KP, Boesiger P. Inherent limitation of the reduction factor in parallel imaging as a function of field strength. *Proc ISMRM* 2002:191.

Golub GH, van Loan CF. In: Matrix Computations. Maryland: Johns Hopkins University Press; 1983. p. 410.

Press WH, Teukolsky SA, Vetterling WT, Flannery BP. In: Numerical recipes in C, 2nd ed. Cambridge: Cambridge University Press; 1992. p. 50.

Katscher U, Manke D. Underdetermined SENSE using a-priori Knowledge. *Proc ISMRM* 2002:2396.

Noll DC, Nishimura DG, Macovski A. Homodyne Detection in Magnetic Resonance Imaging. *IEEE Trans Med Imag* 1991;10:154-163.

King KF, Angelos L. SENSE with Partial Fourier Homodyne Reconstruction. *Proc. ISMRM* 2000:153 and Chapters 18.4-18.7.

Kellman P, Epstein FH, McVeigh ER. Adaptive Sensitivity Encoding Incorporating Temporal Filtering (TSENSE). *Magn Reson Med* 2001;45:846-852.

Griswold MA, Jakob PM, Chen Q, Goldfarb JW, Manning WJ, Edelman RR, Sodickson DK. Resolution enhancement in single-shot imaging using SMASH. *Magn Reson Med* 1999;41:1236-1245.

Sodickson DK, Stuber M, Botnar RM, Kissinger KV, Manning WJ. SMASH Real-Time Cardiac MR Imaging at Echocardiographic Frame Rates. *Proc ISMRM* 1999:387.

Bydder M, Larkman DJ, Hajnal JV. Combination of signals from array coils using image based estimation of coil sensitivity profiles. *Magn Reson Med* 2002;47:539-548.

Pruessmann KP, Weiger M, Bornert P, Boesiger P. Advances in Sensitivity Encoding With Arbitrary k-Space Trajectories. *Magn Reson Med* 2001;46:638-651.

Samsonov AA, Kholmovski EG. Method for Quality Improvement of Images Reconstructed From Sensitivity Encoded Data. *Proc ISMRM* 2002:2408.

Bydder M, Larkman DJ, Hajnal JV. Detection and Elimination of Motion Artefacts by Regeneration of K-space. *Magn Reson Med* 2002;47:677-686.

* cited by examiner

METHODS AND APPARATUS FOR MAGNETIC RESONANCE IMAGING

This Application claims the benefit of U.S. Provisional Application No. 60/465,035, filed Apr. 24, 2003.

FIELD OF THE INVENTION

A field of the invention is magnetic resonance (MR) imaging. The invention particularly concerns processing of data from an MRI scanner.

BACKGROUND OF THE INVENTION

Figure 1:
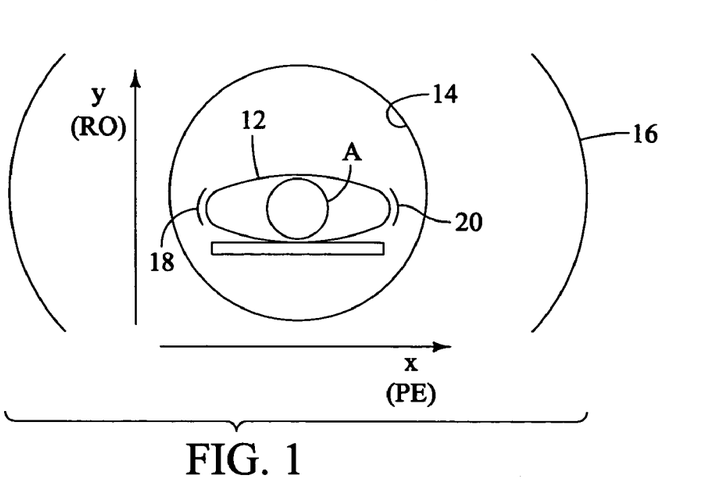
FIG. 1 is an illustrative diagram of a known MRI scanner.

A known magnetic resonance imaging (MRI) scanner 10 is shown in FIG. 1. A patient 12 is slid axially into a bore 14 of a superconducting magnet 16, and the main magnetic field is set up along the axis of the bore, the Z-direction. Magnetic field gradients are set up, for example, in the Z-direction, to confine the excitation of magnetic resonant (MR) active nuclei (typically hydrogen protons in water and fat tissue) to a particular slice in the Z-direction, in the horizontal X and the vertical Y-directions (as shown in FIG. 1), to encode the resonant MR nuclei in the plane of the slice. A radio frequency (RF) transmit coil (not shown) applies an excitation pulse to excite the protons to resonance, and an RF receive coil arrangement comprising an array of receive coils 18, 20 picks up relaxation signals emitted by the disturbed protons.

Figure 2:
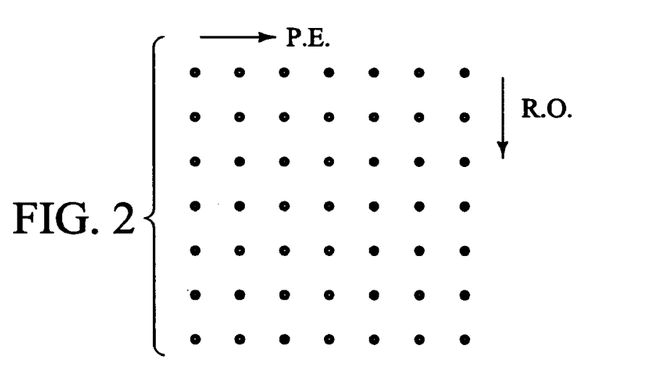
FIG. 2 is an example of k-space data points corresponding to data collected by an MRI scanner.

To encode/decode received signals in the Y-direction, the signals are detected in the presence of a magnetic field gradient, termed a frequency encode or read-out (R.O.) gradient, to enable different positions of relaxing nuclei to correspond to different precession frequencies of those nuclei about the direction of the main magnetic field due to the influence of the gradient. The data is digitized, and so for each RF excitation pulse, a series of digital data points are collected, and these are mapped into a spatial frequency domain known as k-space (FIG. 2). Each RF pulse permits at least one column of digital data points to be collected. The set of data points acquired during one read-out event (for example, one column of FIG. 2) is commonly referred to as a "line" of data.

To encode/decode the received signals in the X-direction, after each RF pulse has been transmitted and before data is collected with the read-out gradient applied, a magnetic field gradient in the X-direction is turned on and off. This is done for a series of magnitudes of magnetic field gradients in the X-direction, one RF pulse typically corresponding to a different magnitude of gradient in the X-direction. On the k-space matrix shown in FIG. 2, the columns of data points correspond to data collected at different magnitudes of phase-encode (PE) gradients.

Figure 3:
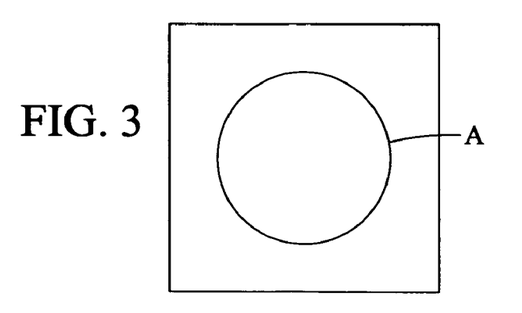
FIG. 3 is an example of an image generated from data points collected by an MRI scanner.

Generally, the field of view imaged by the magnetic resonance imaging scanner 10 depends on the spacing of the data points in the phase-encode and read-out directions, and the resolution of the image depends on how far the points extend in each direction, i.e., how large the maximum phase-encode gradient is, and on the magnitude of the read-out gradient combined with the duration of data collection. Conventionally, the data collected by the RF receive coils 18, 20 is subject to a two-dimensional fast Fourier transform to produce a pixelated spatial image. A slice image A is shown in FIG. 3, which corresponds to area A of the patient 10 shown in FIG. 1. FIG. 3 implies that the spacing of data points in the phase-encode gradient direction is sufficient to image the whole of the circle shown in FIG. 1.

Between each RF pulse, there is a certain minimum pulse repetition time, and the collection of a complete set of phase encode data implied by FIG. 2 may therefore take an undesirably long time. Parallel imaging is an MR imaging technique that uses multiple detectors (phased array coils) to partially replace phase encoding. Each coil measures a set of k-space data points that differ from each other because of the different spatial location and sensitivity of the coils, so the total number of unique measurements is a multiple of the number of coils. For example, if N data points are needed to make an image, these can be obtained from N measurements using one coil or from (N/R) measurements using R coils. Thus parallel imaging is quicker by a factor of up to R. This reduces acquisition times by decreasing the number of phase-encoded lines of k-space that must be acquired. Usually the phase encode data points sampled in parallel imaging are more widely spaced so they cover the same area but with reduced density. Practical implementation of parallel imaging includes SENSE (sensitive encoding) which operates in the image domain, and SMASH (simultaneous acquisition of spatial harmonics) that operates in the k-space matrix.

Navigation refers to an MR imaging technique that is applied during the scan to determine if patient motion has occurred, typically respiratory motion. Navigation uses multiple measurements of a reference part of the anatomy to detect positional changes. If such changes are detected, the affected data points resulting from the motion are corrected or re-acquired. The parallel imaging technique SMASH has been proposed as a way of doing navigation by using previously acquired data to predict the data that have yet to be acquired. Predictions can be adversely affected by systematic errors arising from SMASH data processing and also random errors from low signal to noise ratio (SNR), which reduce the accuracy of the navigation.

Partial Fourier is a technique that reduces the amount of data that is acquired to reduce the MR scan time. Partial Fourier does this by applying certain processing steps (phase correction) that allow one to make the assumption that one half of the k-space data is almost identical to the other half. Therefore, only a little over half the data is needed to make an image.

SUMMARY OF THE INVENTION

A system for generating magnetic resonance images includes an MRI scanner for obtaining data from a pre-scan and data from a selected scan. A processor determines whether the data from the selected scan includes errors based on its consistency with the data from the pre-scan, and requests the MRI scanner to reacquire the data from the selected scan if data is found to include errors, or converts the data from the selected scan to an image if no error is found. A display device displays the image converted by the processor.

DETAILED DESCRIPTION OF THE PREFERRED EMBODIMENTS

The invention is directed to methods and apparatus for generating an image of a portion of a patient scanned by an MRI scanner. In one embodiment of the invention, a processor determines in real-time whether data obtained from a scan contains errors, for example, due to patient motion. If unacceptable level of errors are detected, data is rejected and reacquired from the MRI scanner without converting the data to an image, thereby ensuring that all the accepted data meet a minimum criterion in regard to the acceptable level of error. In another embodiment of the invention, data obtained from the MRI scanner is used to create an image, which is then reconstructed a number of times to suppress poor quality data points which may arise due to patient motion or hardware imperfections. In yet another embodiment of the invention, data from the MRI scanner is obtained in a pattern which would allow creation of an image combining both the partial Fourier imaging method and the parallel imaging method, thereby reducing scan time, and also artifacts and noise in the image.

Figure 4:
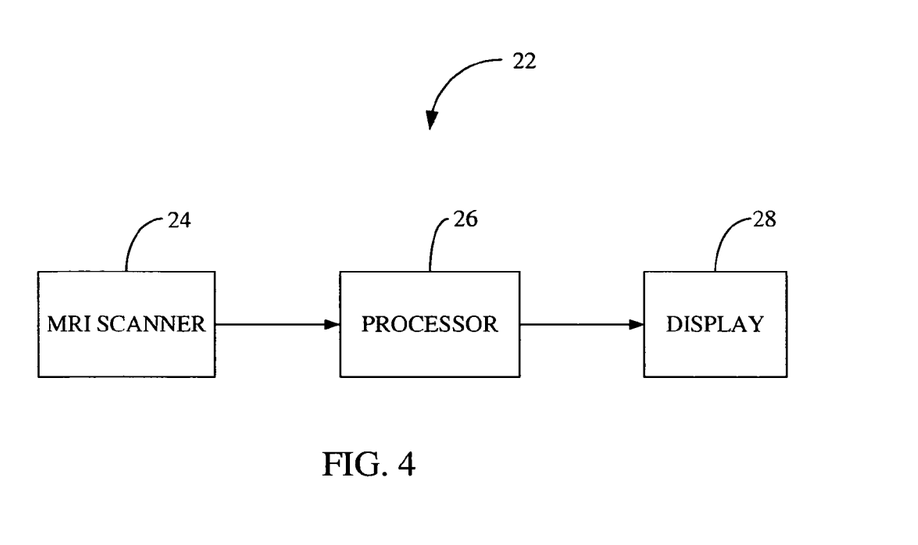
FIG. 4 is a block diagram of a magnetic resonance imaging (MRI) system in accordance with one embodiment of the present invention.

Turning now to FIG. 4, one embodiment of the invention for performing magnetic resonance (MR) imaging involves a magnetic resonance imaging (MRI) system 22 including an MRI scanner 24, a processor 26 and a display 28. The MRI scanner 24 collects data representing a slice of an area of a patient. The processor 26 receives the data obtained by the MRI scanner 24 and converts the data to an image, which is shown on the display 28.

Figure 5:
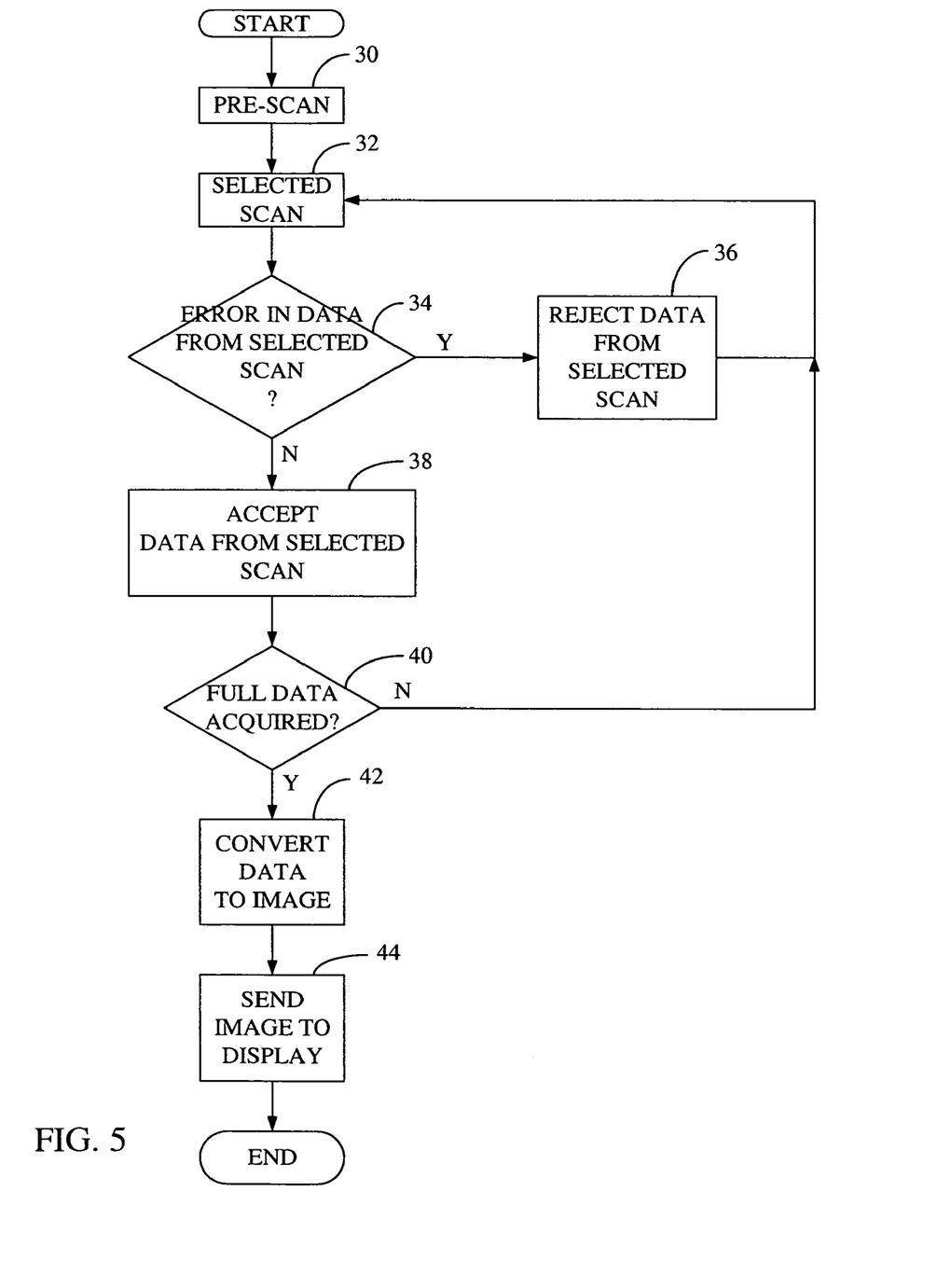
FIG. 5 is a flowchart of a method for processing data from the MRI scanner of FIG. 4 for generating an image in accordance with one embodiment of the invention.

Referring to FIG. 5, one embodiment of the present MRI system 22 for processing data from the MRI scanner 24 includes performing a pre-scan to get coil sensitivity maps (block 30). Pre-scanning generally includes running an additional scan (pre-scan) of the same object as the selected scan prior to the selected scan when the MRI scanner 24 receives an instruction to start. Some of the scan parameters must be the same for both the pre-scan and the selected scan (i.e., the field of view and slice thickness) but other parameters need not be. Thus, the duration of the pre-scan can made be much shorter (for example, less than 1 second).

The data from the pre-scan is passed from the MRI scanner 24 to the processor 26. The selected scan is then started by the MRI scanner 24 (block 32) and the phase encode data obtained from this scan is passed to the processor 26 as they are received. Using the data from the pre-scan and the selected scan, the processor 26 determines whether the data obtained from the selected scan contains errors, due to patient motion, for example (block 34). If so, the data from the selected scan is rejected (block 36) and an instruction is sent from the processor 26 to the MRI scanner 24 to reacquire the phase encode data of the selected scan. Otherwise, the phase encode data is accepted (block 38), and a determination is made as to whether a full data set has been acquired (block 40). If full data set has not been acquired, the next phase encode data of the selected scan is acquired (block 32), and the same error checks are performed on next phase encode data (block 34). When a full data set has been acquired, the processor 26 converts the data set to an image (block 42) and sends the image to the display 28 (block 44).

One embodiment of an algorithm that determines whether the acquired data contains errors (block 32) has been named "Parallel Imaging Navigators" (PINs). The PINs algorithm makes use of the SENSE parallel imaging reconstruction, which is concisely expressed as a linear equation, $$A.x = b \qquad (1)$$

where A is a sensitivity matrix determined from the pre-scan, x is a vector of the desired pixel values in the image, and b is a vector containing the raw k-space data from the selected scan.

After a phase encode data has been acquired, the data set consists of all previous phase encode data plus the newly acquired one, which is possibly corrupt if the patient moved. The above equation (1) is solved both with and without the newly acquired data, and the two solutions are compared. Specifically, one solution is obtained from equation (1) using all of the acquired data from the selected scan, which comprises the previous phase encode data plus the newly acquired phase encode data, and a second solution is obtained from equation (1) using the previous phase encode data only and not the newly acquired phase encode data. In this application the equation is often numerically unstable so numerical regularization is necessary, for example, using standard techniques such as truncated singular value decomposition.

The way the comparison is made is by making a Fourier transform of the two solutions (x) so that they are in k-space, and then taking the difference. In this embodiment, the area of k-space that is supported by the previously acquired data is of interest. If the newly acquired data does not contain errors, the difference will be small, whereas if it does contain errors the difference will be large. In one embodiment, a "cost" function is used to specify the magnitude of the error, namely the sum of the absolute difference between the solutions divided by the sum of the absolute values of the solution obtained without the new data. This cost function only produces positive values, and if its value is greater than approximately 1 then the new data is deemed to contain unacceptable errors. If the value of the cost function is approximately between 0 and 1 then the data is deemed to be within acceptable error. The decision as to whether the new data contains errors is based on the size of the cost function. The threshold value (equal to approximately 1, for example) may be decreased or increased to vary how stringent the acceptable error level should be.

In accordance with another embodiment of the invention, MR data sets received from the MRI scanner 24 (best shown in FIG. 4) is reconstructed using a robust method to resist corrupted data. The term "robust" as used in this patent refers to a mathematical term that relates to the detection of "outliers", i.e., corrupt data points, in a data set and reducing their impact on image reconstruction.

Figure 6:
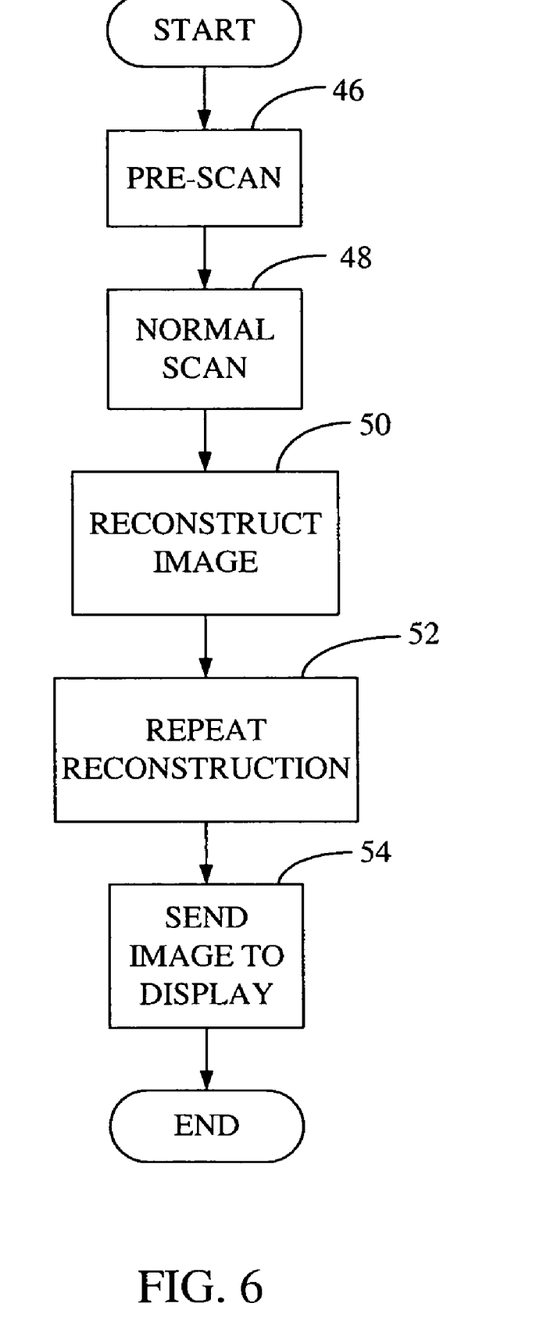
FIG. 6 is a flowchart for a method for processing data from the MRI scanner of FIG. 4 for generating an image in accordance with another embodiment of the invention.

Turning now to FIG. 6, a method for performing robust reconstruction in accordance with one embodiment of the invention includes performing a pre-scan in the MRI scanner 24 and passing the data from the pre-scan to the processor 26 (block 46). Then a selected scan of the subject is started by the MRI scanner 24, and the resulting data passed to the processor 26 (block 48). Once both scans are completed, the processor 26 creates an image using a partially parallel image reconstruction such as the SENSE reconstruction technique (block 50). The processor 26 then uses an algorithm (described below) to repeatedly reconstruct the image in such a way as to suppress poor quality data points (block 52). Poor quality data points may arise due to, for example, patient motion or hardware imperfections. The final image is then passed to the display 28 (block 54).

One embodiment of the algorithm for repeatedly reconstructing the image (block 52) includes solving the equation, $$W.A.x = W.b \quad (2)$$

where W is a diagonal weighting matrix, A is a sensitivity matrix determined from the pre-scan, x is the desired pixel values in the image, and b is the raw k-space data from the normal scan. Equation (2) is a linear equation describing a parallel imaging image reconstruction based on SENSE.

Figure 7:
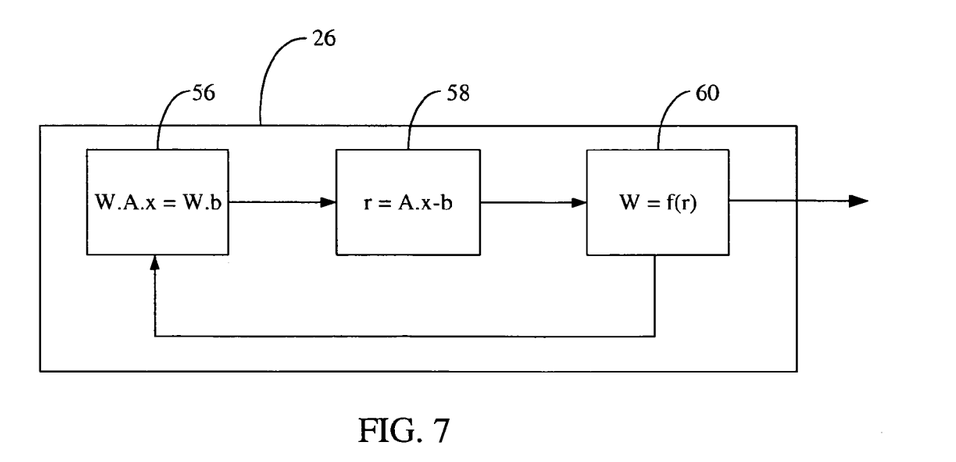
FIG. 7 is a block diagram illustrating the process of repeat reconstruction described in FIG. 6 in accordance with one embodiment of the invention.

Turning now to FIG. 7, the processor 26 arranges the acquired data into a form suitable for the SENSE reconstruction using equation (2). In block 56, the processor 26 solves for x in equation (2) using values for A (obtained from the pre-san) and b (k-space data from the selected scan), and setting W initially to the identity matrix. The value obtained for x is then used to define r=A.x−b (block 58). W is then updated as a function of r, which is denoted f(r) (block 60). The process returns to block 56 now using the new W obtained in block 60. The process in blocks 56–60 are repeated approximately 10 times, for example, after which the resulting image (x) is passed to the display 28.

In one embodiment, Huber function (f(r)=min {1, c/|r|}), is employed in obtaining the weighting factors W. It should understood, however, that many other weighting factors (also known as M-estimators) may also be used, such as, for example, Cauchy (f(r)=1/(1+(r/c)$^2$)); Fair (f(r)=1/(1+|r/c|)); Welsch f(r)=exp(−(r/c)$^2$), where c is a constant scaling factor equal to some multiple of the median value of |r|. The value of c determines how strongly the outliers are suppressed. For example, c=3. median(|r|) is a "medium" value, whereas c=1. median(|r|) indicates strong suppression, and c=5. median(|r|) indicates not very strong suppression.

In accordance with another embodiment of the present invention, hereinafter referred as a partial Fourier partially parallel (PFPP) imaging method, is used to reduce scan times in the MRI scanner 24. Generally, PFPP imaging method combines the speed advantages of the partial Fourier and the partially parallel imaging techniques. The partial Fourier technique of acquiring half the data is used with the parallel imaging method of reducing the number of measurements, resulting in shortened scan times and less noise in images.

Figure 8:
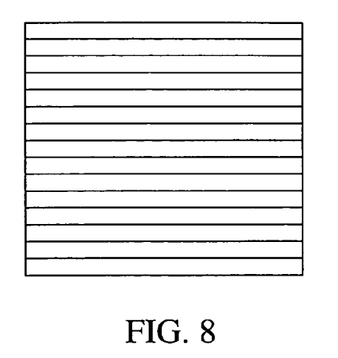
FIG. 8 is an example of a sampling pattern of data obtained by an MRI scanner without any time reducing methods.
Figure 9:
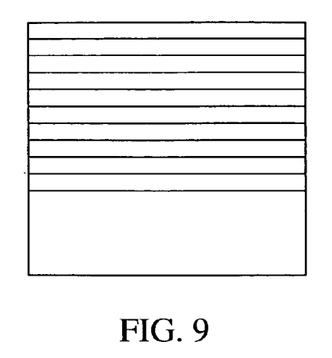
FIG. 9 is an example of a sampling pattern of data obtained by an MRI scanner for generating an image using a partial Fourier imaging method.
Figure 10:
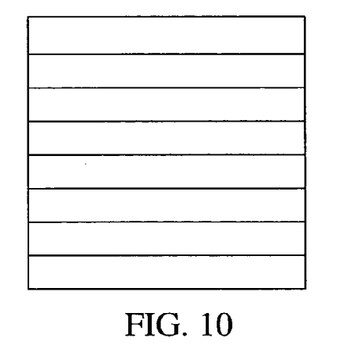
FIG. 10 is an example of a sampling pattern of data obtained by an MRI scanner for generating an image using a parallel imaging reconstruction method.

Turning to FIGS. 8–10, various data sampling patterns are illustrated. FIG. 8 is a data sampling pattern (e.g., 256 phase encode lines of data) obtained by an MRI scanner without using any time reducing methods. This method typically results in high quality image, but suffers from lengthy scan time. FIG. 9 shows a sampling pattern obtained using a partial Fourier method, which requires less lines of data (e.g., 136 lines), and therefore, reduced scan time. This method, however, is prone to more artefacts. Parallel Imaging method, as shown in FIG. 10, requires even less lines of data (e.g., 100 lines) and less time than the partial Fourier method, but is prone to noise. In the present context, "artifacts" are considered to be aberrations in the image, such as bright spots or smearing effects, that do not correctly represent the spatial properties of the object. "Noise" is considered a random speckling effect on the image that tends to obscure fine detail, and is the visual equivalent of static on radio signals.

Figure 11:
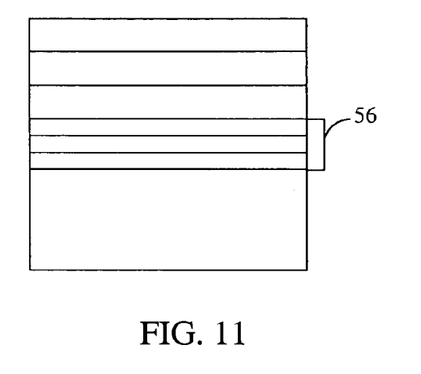
FIG. 11 is a data sampling pattern obtained from the MRI scanner of FIG. 4 for performing image generation using a data processing method in accordance with yet another embodiment of the present invention.

FIG. 11 shows a k-space sampling patterns obtained in accordance with the PFPP imaging method of the present invention. The PFPP imaging method requires less data (e.g., 86 lines) than either the partial Fourier method or the parallel imaging method, and accordingly, less scan time than these two methods separately. As shown in the FIG. 11, the central region 56 of the data (which typically refers to the data within an area approximately 16 to 32 points of the middle of the k-space matrix) is fully sampled (i.e., as in FIG. 8, without any time reducing methods) to provide phase information to do partial Fourier and coil sensitivity information to do the parallel imaging reconstruction.

As described above, coil sensitivity information is what is usually measured in a pre-scan. It is necessary to obtain this information when using the partial Fourier or parallel imaging techniques. In this embodiment, instead of using a pre-scan, another known technique is to incorporate the necessary measurements into the second scan, which means just a single scan is made but the central region 56 is acquired at full density. This is known as "auto calibration" or homodyne detection.

Referring back to FIG. 4, in the PFPP imaging method of the invention, data in the pattern described above with respect to FIG. 11 is acquired by the MRI scanner 24 by programming the scanner to obtain the data in that specified pattern. The MRI scanner 24 is programmed using software tools provided by the manufacturer, and the scanner is typically instructed to acquire a central region corresponding to approximately $\frac{1}{8}^{th}$ the size of the k-space matrix plus a number of measurements spread over the outer areas of the k-space matrix. For example, if the k-space matrix were of dimensions 256×256 then the acquired data set might consist of 32 central lines plus 64 lines covering the outer areas of the k-space matrix. Both sides of the k-space matrix may be covered or one side only. The number of lines and their pattern of distribution within the k-space matrix are varied to alter the overall time taken for the scan and the image quality (i.e. noise level, artifact level). Specific choices depend on the scanner used, the number of coil receivers and the requirements of the scan. For example, with a 256×256 k-space matrix a fast scan producing a moderate quality image may comprise 32 central lines and 32 outer lines covering one side of k-space; whereas a higher quality scan may comprise 32 central lines and 128 outer lines covering both sides of k-space. In the latter case the outer lines are arranged so that they are not in "conjugate symmetric" pairs, which means if the k-space matrix is folded in half then the outer lines will not over-lap each other. Following the data acquisition, the data is passed on to the processor 26, where it is processed using an algorithm (discussed below) to generate an image. The obtained image is passed to the display 28.

The algorithm for generating image in the processor 26 in the PFPP imaging technique includes performing a parallel imaging reconstruction, i.e., solving the equation, $$A.x=b \quad (3)$$

constrained so that the solution (x) also obeys the requirements of partial Fourier. This requires that the imaginary part of x be zero. This is brought about by separating equation (3) into real and imaginary parts and regularizing the imaginary part, i.e., $$\begin{bmatrix} \text{Re}\{b\} \\ \text{Im}\{b\} \\ 0 \end{bmatrix} = \begin{bmatrix} \text{Re}\{A\} & \text{Im}\{-A\} \\ \text{Im}\{A\} & \text{Re}\{A\} \\ 0 & \lambda I \end{bmatrix} \begin{bmatrix} \text{Re}\{x\} \\ \text{Im}\{x\} \end{bmatrix} \quad (4)$$

where, A is a sensitivity matrix determined from the fully sampled central region 56 of data (best shown in FIG. 11), x is the desired pixel values in the final image, b is the raw k-space data from the scan, I is the identity matrix and $\lambda$ is a scalar to weaken/strengthen the constraint. In one embodiment, the known. "sum-of-squares" coil modulation is used when making the sensitivity matrix.

One example of a computer algorithm that implements this expression is as follows:

$$x = 0$$
$$d = A^H b$$
$$r = d$$
$$\text{for } j = 0, 1, \ldots$$
$$\{$$
$$q = A^H A d + i\lambda^2 \text{Im}\{d\}$$
$$x = x + \frac{r_j^H r_j}{d^H q} d$$
$$r_{j+1} = r_j - \frac{r_j^H r_j}{d^H q} q$$
$$d = r_{j+1} + \frac{r_{j+1}^H r_{j+1}}{r_j^H r_j} d$$
$$\}$$

where superscript H denotes the mathematical operation for hermitian transpose.

In accordance with the PFPP imaging method of the invention, less data is required than either partial Fourier or partially parallel imaging to generate image from the MRI scanner 24. By varying the parameter $\lambda$, the PFPP imaging method can be adjusted to offer the advantages of fewer artefacts than partial Fourier and less noise than partially parallel imaging.

The PFPP imaging method of the invention may be combined with the robust reconstruction method of the invention described above for outlier suppression by substituting the following equation (5) in place of equation (2) and using equation (5) in the block 56 of FIG. 7:

$$\begin{bmatrix} W_r & 0 & 0 \\ 0 & W_i & 0 \\ 0 & 0 & W_\lambda \end{bmatrix} \begin{bmatrix} \text{Re}\{b\} \\ \text{Im}\{b\} \\ 0 \end{bmatrix} = \begin{bmatrix} W_r & 0 & 0 \\ 0 & W_i & 0 \\ 0 & 0 & W_\lambda \end{bmatrix} \begin{bmatrix} \text{Re}\{A\} & \text{Im}\{-A\} \\ \text{Im}\{A\} & \text{Re}\{A\} \\ 0 & \lambda I \end{bmatrix} \begin{bmatrix} \text{Re}\{x\} \\ \text{Im}\{x\} \end{bmatrix} \quad (5)$$

where $W_r$, $W_i$ and $W_\lambda$ are diagonal weighting matrices. Different weighting functions described above can be used for each weighting matrix. In one embodiment $W_\lambda$ is fixed equal to the identity matrix. The result of this substitution is an enhancement of the error suppression compared with the images produced by equation (2).

While specific embodiments of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for generating magnetic resonance images of a subject, comprising:

using an MRI scanner to scan a desired area of the subject in a specified pattern so that a predetermined central region of data in a k-space matrix is fully sampled and a select outer area of said k-space matrix is partially sampled;

generating an image from data obtained from said scan using an algorithm which performs parallel imaging reconstruction on said data while obeying requirements of partial Fourier reconstruction.

2. The method as defined in claim 1, wherein said image generating algorithm comprises solving a first equation, $$A.x=b$$

constrained so that the solution (x) also obeys the requirements of partial Fourier, where, A is a sensitivity matrix determined from said fully sampled central region of data, x is the desired pixel values in the image, and b is the raw k-space data from the MRI scanner.

3. The apparatus as defined in claim 2, wherein a sum-of-squares coil modulation is used in making said sensitivity matrix.

4. The method as defined in claim 2, wherein solving said first equation comprises converting said first equation into a second equation, $$\begin{bmatrix} \mathrm{Re}\{b\} \\ \mathrm{Im}\{b\} \\ 0 \end{bmatrix} = \begin{bmatrix} \mathrm{Re}\{A\} & \mathrm{Im}\{-A\} \\ \mathrm{Im}\{A\} & \mathrm{Re}\{A\} \\ 0 & \lambda I \end{bmatrix} \begin{bmatrix} \mathrm{Re}\{x\} \\ \mathrm{Im}\{x\} \end{bmatrix}$$

by separating said first equation into real and imaginary parts and regularizing the imaginary part, and setting the imaginary part of x to be zero, I is the identity matrix and λ is a scalar to weaken or strengthen the constraint.

5. The method as defined in claim 1, wherein a plurality of lines of data from said select outer area of said k-space matrix is sampled with respect to and on at least one side of said central region.

6. Apparatus for generating magnetic resonance images of a subject, comprising:

an MRI scanner generating data from a scan of the subject in a specified pattern so that a predetermined central region of data in a k-space matrix is fully sampled and a select outer area of said k-space matrix is partially sampled;

a processor for generating an image from data from said MRI scanner using an algorithm which performs parallel imaging reconstruction on said data while obeying requirements of partial Fourier reconstruction; and display means for displaying the image generated by said processor.

7. The apparatus as defined in claim 6, wherein said image generating algorithm comprises solving a first equation, $$A.x=b$$

constrained so that the solution (x) also obeys the requirements of partial Fourier, where, A is a sensitivity matrix determined from said fully sampled central region of data, x is the desired pixel values in the image, and b is the raw k-space data from said MRI scanner.

8. The apparatus as defined in claim 7, wherein solving said first equation comprises converting said first equation into a second equation, $$\begin{bmatrix} \mathrm{Re}\{b\} \\ \mathrm{Im}\{b\} \\ 0 \end{bmatrix} = \begin{bmatrix} \mathrm{Re}\{A\} & \mathrm{Im}\{-A\} \\ \mathrm{Im}\{A\} & \mathrm{Re}\{A\} \\ 0 & \lambda I \end{bmatrix} \begin{bmatrix} \mathrm{Re}\{x\} \\ \mathrm{Im}\{x\} \end{bmatrix}$$

by separating said first equation into real and imaginary parts and regularizing the imaginary part, and setting the imaginary part of x to be zero, I is the identity matrix and λ is a scalar to weaken or strengthen the constraint.

9. The apparatus as defined in claim 7, wherein a plurality of lines of data from said select outer area of said k-space matrix is sampled with respect to and on at least one side of said central region.

10. The apparatus as defined in claim 7, wherein a sum-of-squares coil modulation is used in making said sensitivity matrix.

11. A method for generating magnetic resonance images of a subject, comprising:

using an MRI scanner to scan a desired area of the subject in a specified pattern so that a central region of data in a k-space matrix is fully sampled; and generating an image from data obtained from said scan using an algorithm which which includes solving a first equation, $$A.x=b$$

constrained so that the solution (x) also obeys the requirements of partial Fourier, where, A is a sensitivity matrix determined from said fully sampled central region of data, x is the desired pixel values in the image, and b is the raw k-space data from the MRI scanner.

12. The method as defined in claim 11, wherein solving said first equation comprises converting said first equation into a second equation, $$\begin{bmatrix} \mathrm{Re}\{b\} \\ \mathrm{Im}\{b\} \\ 0 \end{bmatrix} = \begin{bmatrix} \mathrm{Re}\{A\} & \mathrm{Im}\{-A\} \\ \mathrm{Im}\{A\} & \mathrm{Re}\{A\} \\ 0 & \lambda I \end{bmatrix} \begin{bmatrix} \mathrm{Re}\{x\} \\ \mathrm{Im}\{x\} \end{bmatrix}$$

by separating said first equation into real and imaginary parts and regularizing the imaginary part, and setting the imaginary part of x to be zero, I is the identity matrix and λ is a scalar to weaken or strengthen the constraint.

* * * * *

UNITED STATES PATENT AND TRADEMARK OFFICE
CERTIFICATE OF CORRECTION

PATENT NO. : 7,078,898 B2 Page 1 of 1
APPLICATION NO. : 10/830984
DATED : July 18, 2006
INVENTOR(S) : Bydder It is certified that error appears in the above-identified patent and that said Letters Patent is hereby corrected as shown below:

Col. 7, line 66, please delete "known." and insert --known-- therefor.

Signed and Sealed this

Twenty-sixth Day of December, 2006

JON W. DUDAS
*Director of the United States Patent and Trademark Office*